US010297750B1

(12) United States Patent
Ando et al.

(10) Patent No.: US 10,297,750 B1
(45) Date of Patent: May 21, 2019

(54) WRAPAROUND TOP ELECTRODE LINE FOR CROSSBAR ARRAY RESISTIVE SWITCHING DEVICE

(71) Applicant: INTERNATIONAL BUSINESS MACHINES CORPORATION, Armonk, NY (US)

(72) Inventors: Takashi Ando, Tuckahoe, NY (US); Benjamin D. Briggs, Waterford, NY (US); Lawrence A. Clevenger, Rhinebeck, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/814,932

(22) Filed: Nov. 16, 2017

(51) Int. Cl.
*H01L 45/00* (2006.01)
*H01L 27/108* (2006.01)
*H01L 27/24* (2006.01)
*H01L 27/11521* (2017.01)

(52) U.S. Cl.
CPC ........ *H01L 45/1253* (2013.01); *H01L 27/108* (2013.01); *H01L 27/11521* (2013.01); *H01L 27/2436* (2013.01); *H01L 27/2481* (2013.01); *H01L 45/1226* (2013.01); *H01L 45/1625* (2013.01)

(58) Field of Classification Search
CPC ............. H01L 45/1253; H01L 27/2481; H01L 45/1625; H01L 45/1226; H01L 27/108; H01L 27/2436; H01L 27/11521
See application file for complete search history.

(56) References Cited

U.S. PATENT DOCUMENTS

| | | | |
|---|---|---|---|
| 8,395,935 | B2 | 3/2013 | Lung et al. |
| 8,796,795 | B2 | 8/2014 | Satoh et al. |
| 9,331,277 | B2 | 5/2016 | Chen et al. |

(Continued)

OTHER PUBLICATIONS

Waser et al., "Integration of TiO2 into Nano-Crossbar Arrays with 100 nm Half Pitch for Resistive RAM Applications," Electronic Materials Research Laboratory. Research. http://www.emrl.de/r_a_1.html. Downloaded Sep. 7, 2017. pp. 1-10.

(Continued)

*Primary Examiner* — Mohammed A Bashar
(74) *Attorney, Agent, or Firm* — Tutunjian & Bitetto, P.C.; Vazken Alexanian

(57) ABSTRACT

A method is presented for forming a semiconductor device. The method includes depositing an insulating layer over a semiconductor substrate, etching the insulating layer to form a plurality of trenches for receiving a first conducting material, forming a resistive switching memory element over at least one trench of the plurality of trenches, the resistive switching memory element having a conducting cap formed thereon, and depositing a dielectric cap over the trenches. The method further includes etching portions of the insulating layer to expose a section of the dielectric cap formed over the resistive switching memory element, etching the exposed section of the dielectric cap to expose the conducting cap of the resistive switching memory element, and forming a barrier layer in direct contact with the exposed section of the conducting cap.

20 Claims, 4 Drawing Sheets

(56) References Cited

U.S. PATENT DOCUMENTS

| | | | | |
|---|---|---|---|---|
| 9,627,612 | B2 | 4/2017 | BrightSky et al. | |
| 9,653,682 | B1 | 5/2017 | Chou et al. | |
| 2008/0277703 | A1 | 11/2008 | Iwayama | |
| 2016/0093672 | A1 | 3/2016 | Li et al. | |
| 2017/0309324 | A1* | 10/2017 | Kumar | G11C 11/4091 |
| 2018/0166501 | A1* | 6/2018 | Chuang | H01L 27/226 |

OTHER PUBLICATIONS

Wong et al., "Metal-Oxide RRAM," Proceedings of the IEEE. vol. 100. Issue 6. May 2, 2012. pp. 1951-1970.

U.S. Patent and Trademark Office. Office Action from U.S. Appl. No. 13/136,454 dated Nov. 19, 2013. Issued as U.S. Pat. No. 8,796,795 on Aug. 5, 2014. pp. 1-9.

* cited by examiner

WRAPAROUND TOP ELECTRODE LINE FOR CROSSBAR ARRAY RESISTIVE SWITCHING DEVICE

BACKGROUND

Technical Field

The present invention relates generally to semiconductor devices, and more specifically, to forming a wraparound top electrode line for a crossbar array resistive switching device.

Description of the Related Art

Memories have been widely used in various electronic products. Due to the increasing need of data storage, the demands of capacities and performances of the memories become higher and higher. Among various memory elements, resistive random access memories (RRAMs) have a low operating voltage, a high read/write speed, and high miniaturization of element size and, thus, can replace conventional flash memories and dynamic random access memories (DRAMs) as the main stream of memory elements of the next generation.

SUMMARY

In accordance with an embodiment, a method is provided for forming a semiconductor device. The method includes depositing an insulating layer over a semiconductor substrate, etching the insulating layer to form a plurality of trenches for receiving a first conducting material, forming a resistive switching memory element over at least one trench of the plurality of trenches, the resistive switching memory element having a conducting cap formed thereon, and depositing a dielectric cap over the trenches. The method further includes etching portions of the insulating layer to expose a section of the dielectric cap formed over the resistive switching memory element, etching the exposed section of the dielectric cap to expose the conducting cap of the resistive switching memory element, and forming a barrier layer in direct contact with the exposed section of the conducting cap.

In accordance with an embodiment, a method is provided for forming a semiconductor device. The method includes forming a plurality of copper (Cu) contacts within an insulating layer, forming a resistive random access memory (RRAM) device over one Cu line of the plurality of Cu lines, forming a conducting cap over the RRAM device, forming a dielectric cap that extends over and directly contacts each of the plurality of Cu lines, selectively etching to expose the conducting cap of the RRAM device, and forming a barrier layer in direct contact with the exposed conducting cap.

In accordance with another embodiment, a semiconductor device is provided. The semiconductor device includes a plurality of trenches formed within an insulating layer for receiving a first conducting material, a resistive switching memory element formed over at least one trench of the plurality of trenches, the resistive switching memory element having a conducting cap formed thereon, a dielectric cap deposited over the trenches, and a barrier layer formed in direct contact with an exposed section of the conducting cap such that the conducting cap wraps around with the barrier layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
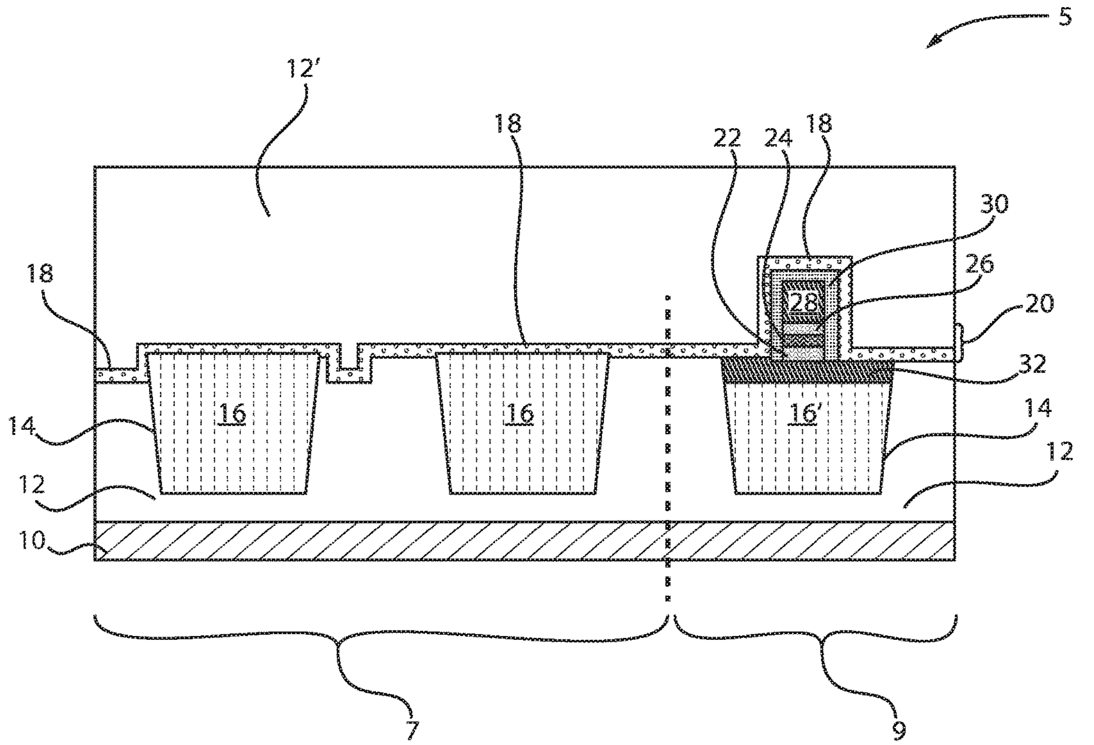
FIG. 1 is a cross-sectional view of a semiconductor structure including copper (Cu) lines formed within an insulating layer, as well as a resistive switching memory element formed over at least one Cu line, in accordance with an embodiment of the present invention.

Embodiments in accordance with the present invention provide methods and devices for improving resistive switching memories. With the explosive growth of digital data in the era of Internet of Things (IoT), fast and scalable technologies including resistive switching memories are being explored for data storage and data-driven computation. A resistive switching memory (RRAM) offers high speed, high density, and low cost of fabrication as a result of its two-terminal structure. RRAM devices offer advantages in terms of area occupation, speed, and scaling. A common denominator for RRAM devices is that they are resistive memories where the resistance serves as a probed state variable. The resistance can be changed by electrical pulses according to various physical processes. For example, in an RRAM device, the resistance usually changes according to a state of a conductive filament within an insulating oxide layer. Moreover, the two-terminal structure of RRAM devices can be accommodated in a crosspoint or crossbar array where dense packing of wordlines and bitlines allows for an extremely small bit area. Another advantage of RRAM devices is the ability to independently program and erase each device, as well as the ability to accomplish faster switching, usually in a range of 100 nanoseconds (ns). The short switching time, combined with relatively low-voltage operation also allows for low program and erase energy use for low-power consumption.

Embodiments in accordance with the present invention provide methods and devices for improving resistive switching memories by forming a wraparound top electrode line for a crossbar array resistive switching device. In particular, conducting lines, such as copper (Cu) lines are formed within an insulating layer. At least one Cu line includes a resistive switching memory element formed thereon. A dielectric cap is formed over each of the Cu lines. The dielectric cap extends, continuously or in a non-interrupted manner, over each of the Cu lines and engages each of the Cu lines (or a barrier layer of the Cu lines). The dielectric cap contacts a top surface of Cu lines not including a resistive switching memory element, whereas the dielectric cap covers the resistive switching memory element formed over at least one Cu line. Selective etching is performed to expose a top portion of the resistive switching memory element and to deposit a conducting layer (metallization) in contact with the resistive switching memory element. The final RRAM structure can be incorporated into a 3D RRAM crossbar array including a plurality of wordlines and bitlines. The resistive switching memory element can be at least an oxide-based RRAM or a conductive bridging RAM (CBRAM), a magnetic random access memory (MRAM), a phase change memory (PCM), or a ferroelectric tunneling junction (FTJ).

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

FIG. 1 is a cross-sectional view of a semiconductor structure including copper (Cu) lines formed within an insulating layer, as well as a resistive switching memory element formed over at least one Cu line, in accordance with an embodiment of the present invention.

A semiconductor structure 5 includes a semiconductor substrate 10. An insulator layer 12 is deposited over the substrate 10. The insulating layer 12 is etched to form trenches thereon. A conductive fill material or liner 14 is formed or deposited around each of the trenches. In one example, the liner can be a tantalum nitride (TaN) liner 14 or in the alternative a tantalum (Ta) liner 14. In one example embodiment, the conductive fill material 14 can be deposited, for example, by electroplating, electroless plating, chemical vapor deposition (CVD), atomic layer deposition (ALD) and/or physical vapor deposition (PVD).

The trenches are then configured to receive a conducting material. The conducting material can be a metal, such as copper (Cu) 16, 16'. In the exemplary embodiment, two Cu regions 16 and one Cu region 16' are illustrated for the sake of clarity. One skilled in the art may contemplate a plurality of Cu regions 16, 16' defined within the insulator layer 12. Cu regions 16 are formed in a first region or area 7 of the semiconductor structure 5, whereas Cu region 16' is formed in a second region or area 9 of the semiconductor structure 5.

A resistive switching memory (RRAM) 20 is formed over the Cu region 16'. The RRAM stack 20 includes a first layer 22, a second layer 24, and a third layer 26. The first layer 22 can be a metal layer. The second layer 24 can be an insulating layer, such as a metal oxide layer. The third layer 26 can be a metal layer. In one example embodiment, the first and third layers 22, 26 can be formed of the same material.

Stated differently, the resistive switching memory element 20 includes an insulating layer 24, usually a metal oxide (MeOx), interposed between a top electrode (TE) 26 and a bottom electrode (BE) 22, both generally including metallic layers or stacks. The resistive switching memory element 20 is initially subjected to the operation of electroforming, or simply forming, where a conductive filament (CF) is formed by dielectric breakdown. The current is limited by a compliance system or a series resistor/transistor during forming, which allows the size of the CF to be controlled and avoids destructive (hard) breakdown of a switching layer. After formation, the device manifests improved conductance as the CF connects the TE and BE by shunting the insulating layer, thus resulting in a low-resistance state (LRS) of the RRAM 20.

A conducting cap 28 can be formed over the RRAM stack 20. The conducting cap 28 can be a metal cap. The conducting cap 28 can include, e.g., tantalum (Ta), tantalum nitride (TaN), titanium (Ti), titanium nitride (TiN), cobalt (Co), cobalt nitride (CoN), ruthenium (Ru), and/or ruthenium nitride (RuN), and/or other metals or metallic alloys. A spacer 30 is formed over or covers or surrounds the RRAM stack 20 and the conducting cap 28. The spacer 30 can be, e.g., a silicon nitride (SiN) spacer.

Additionally, a barrier layer 32 is formed between the Cu region 16' and the RRAM stack 20. The barrier layer 32 can, e.g., prevent Cu diffusion.

A dielectric cap 18 is then deposited over the Cu regions 16, 16'. The dielectric cap 18 extends over and contacts each of the plurality of Cu regions 16, 16'. The dielectric cap 18 is a continuous or non-interrupted layer that contacts or engages an upper surface of each of the Cu regions 16 and the barrier layer 32 of the Cu region 16'. The dielectric cap 18 covers or encloses or encapsulates the RRAM stack 20 formed over the Cu region 16'. The dielectric cap 18 has a substantially consistent thickness across the semiconductor structure 5. Another insulating layer 12' is formed over the dielectric cap 18 to complete the semiconductor structure 5. In various embodiments, a height of the insulating layer 12' can be reduced by chemical-mechanical polishing (CMP) and/or etching. Therefore, the planarization process can be provided by CMP. Other planarization process can include grinding and polishing.

Figure 2:
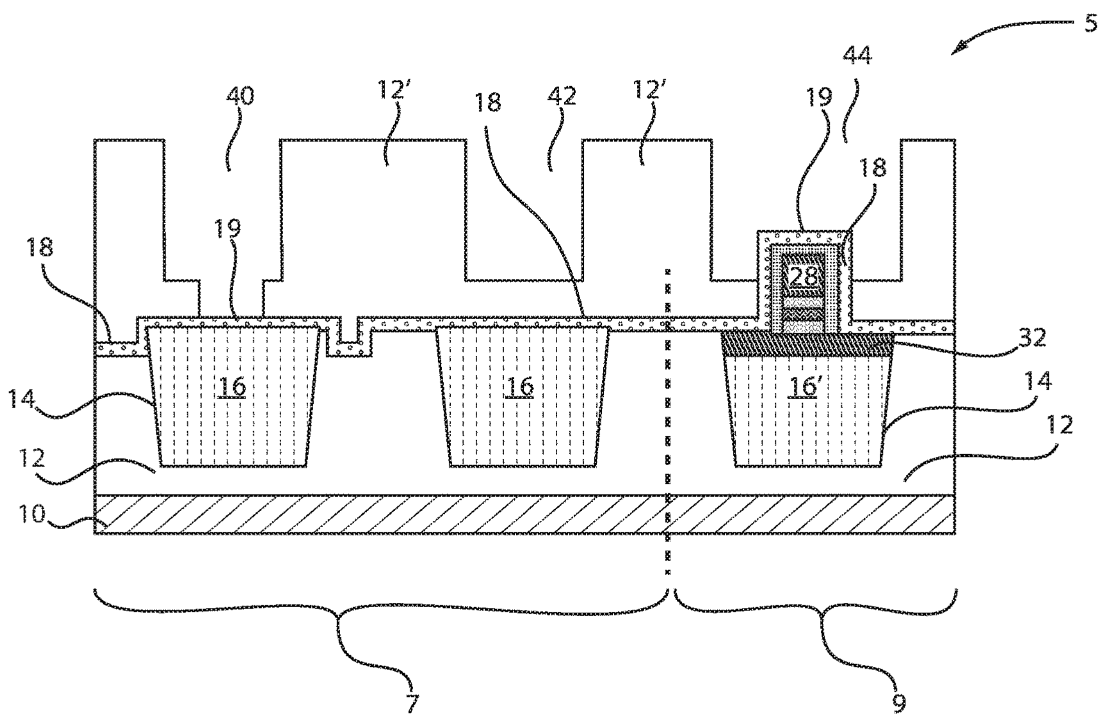
FIG. 2 is a cross-sectional view of the semiconductor structure of FIG. 1 where the insulating layer is etched to expose portions of a dielectric cap, in accordance with an embodiment of the present invention.

FIG. 2 is a cross-sectional view of the semiconductor structure of FIG. 1 where the insulating layer is etched to expose portions of a dielectric cap, in accordance with an embodiment of the present invention.

In various example embodiments, the insulating layer 12' is etched to form a first recess 40, a second recess 42, and a third recess 44. The etching can include a dry etching process such as, for example, reactive ion etching, plasma etching, ion etching or laser ablation. The etching can further include a wet chemical etching process in which one or more chemical etchants are used to remove portions of the layers. The third recess extends deeper below the top surface of the conducting cap 28 to achieve wraparound top electrode lines.

The first recess 40 extends to a top surface 19 of the dielectric cap 18. The second recess 42 does not extend to the dielectric cap 18. The first and second recesses 40, 42 are formed in the first region 7 of the structure 5. The third recess 44 is formed in the second region 9 of the structure 5. The third recess extends to a top surface 19 of the dielectric cap 18 formed over the resistive switching memory element 20.

Figure 3:
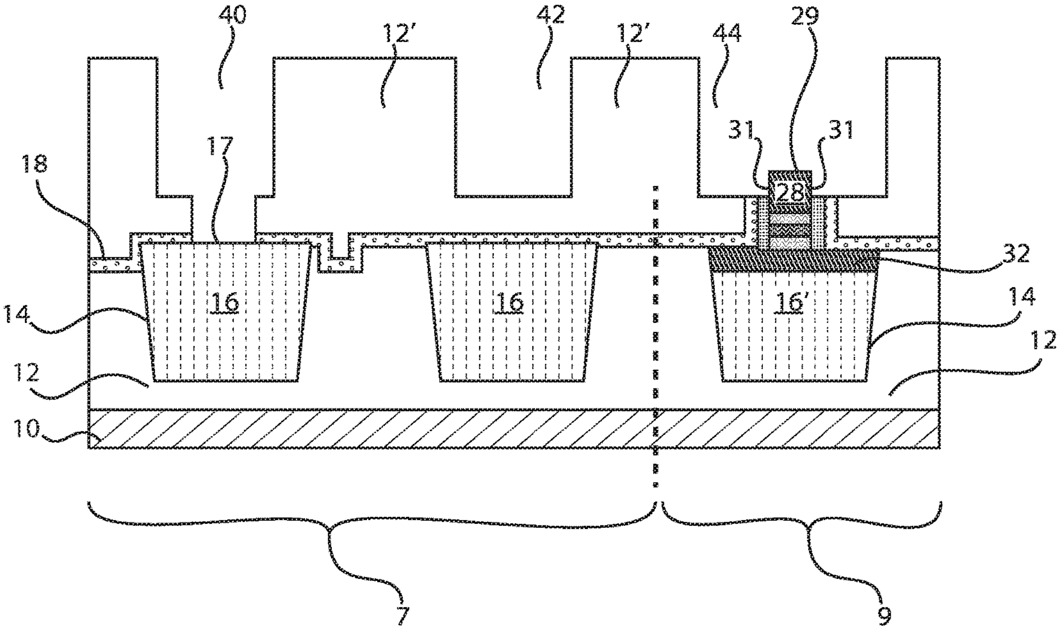
FIG. 3 is a cross-sectional view of the semiconductor structure of FIG. 2 where a conductive cap of the resistive switching memory element is exposed after etching of the dielectric cap, in accordance with an embodiment of the present invention.

FIG. 3 is a cross-sectional view of the semiconductor structure of FIG. 2 where a conductive cap of the resistive switching memory element is exposed after etching of the dielectric cap, in accordance with an embodiment of the present invention.

In various example embodiments, the exposed dielectric cap 18 is etched from the first recess 40. This results in a top surface 17 of the Cu region 16 being exposed. Additionally, the exposed dielectric cap 18 is etched from the third recess 44 and the spacer 30 is also etched to expose a top surface 29 of the conductive cap 28. Additionally, side surfaces 31 of the conductive cap 28 are also exposed.

Figure 4:
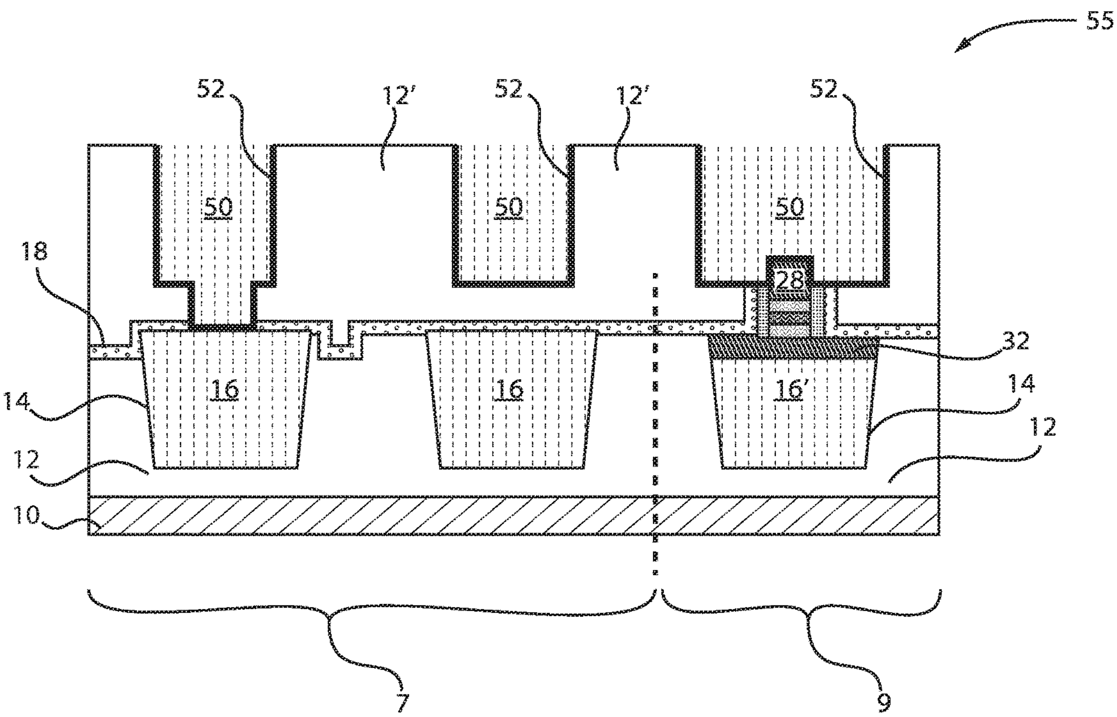
FIG. 4 is a cross-sectional view of the semiconductor structure of FIG. 3 where a barrier layer is formed in direct contact with the conductive cap of the resistive switching memory element, in accordance with an embodiment of the present invention.

FIG. 4 is a cross-sectional view of the semiconductor structure of FIG. 3 where a barrier layer is formed in direct contact with the conductive cap of the resistive switching memory element, in accordance with an embodiment of the present invention.

In various example embodiments, conducting liner 52 is formed over each of the recesses 40, 42, 44. The conducting liner 52 can be a metal liner. The metal can be, e.g., the same metal used to form the conducting cap 28 of the RRAM 20. A conducting material 50 can then be received by each of the recesses 40, 42, 44 to complete the metallization process. The conducting material 50 can be, e.g., Cu. The conducting material 50 contacts the entire inner surface of the metal liner 52. The conducting material can extend up to a top surface of the insulating layer 12'. The metal liner 52 wraps around the RRAM stack 20 in the second region 9. This increases the metal line volume to efficiently reduce the resistance and to provide for a better contact between the top metal line 52 and the RRAM 20. The metal liner 52 contacts the conducting cap 28 formed over the Cu region 16' in the second region 9. The metal liner 52 can be referred to as a wraparound top electrode line for the resistive switching element 20. The metal liner 52 can also be referred to as a barrier layer. The final structure is designated as 55.

Therefore, the top portions of the top electrodes are embedded in the metal line itself without via contact. Stated differently, identical memory elements are embedded in top electrode lines to form a matrix. In other words, the top electrode of the RRAM stack or the conducting cap 28 is wrapped around the metal liner 52 or embedded in the Cu line. It is noted that the Cu trenches run perpendicular to the pages illustrating FIGS. 1-4.

Figure 5:
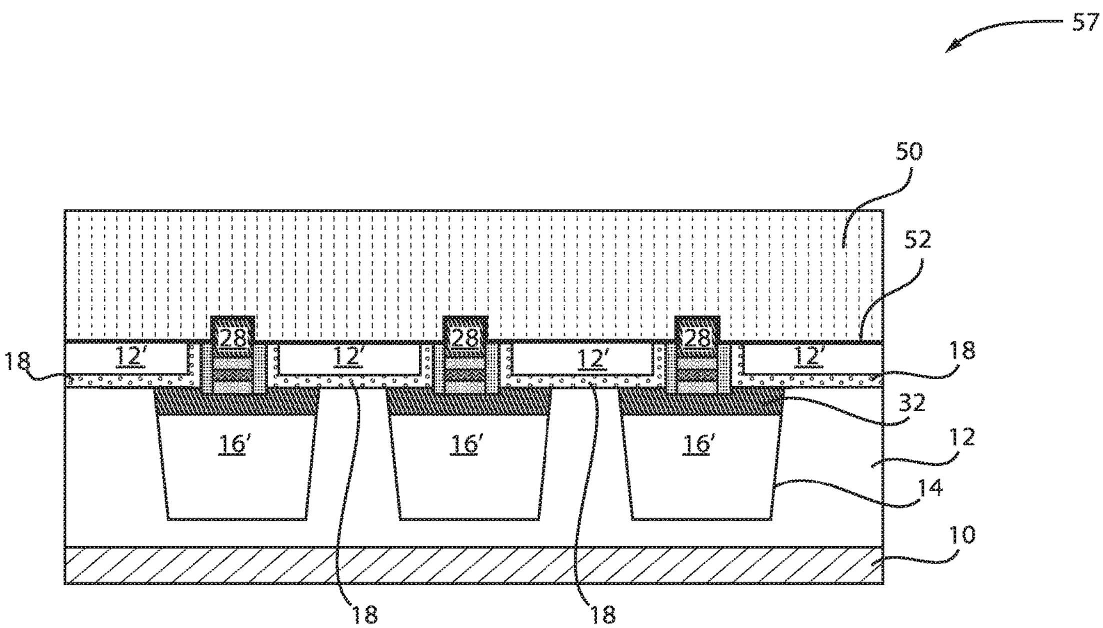
FIG. 5 is a cross-sectional view of the semiconductor structure of FIG. 4 that is parallel to the top Cu line, thus illustrating the resistive random access memory (RRAM) area, in accordance with an embodiment of the present invention.

FIG. 5 is a cross-sectional view of the semiconductor structure of FIG. 4 that is parallel to the top Cu line, thus illustrating the resistive random access memory (RRAM) area, in accordance with an embodiment of the present invention.

In various example embodiments, the RRAM area 57 is shown parallel to the top Cu line. The top metal line wraps around the RRAM. This results in an increase in the metal line volume, reduction of resistance, and better contact between the top metal line 52 and the RRAM 20. Therefore, the RRAM stack 20 is lodged or wedged between the Cu region 16' and the metal line 52 (e.g., Cu). The RRAM stack 20 is thus positioned or embedded between Cu region 16' and Cu liner 52. The RRAM stacks 20 are substantially aligned. The top lines and the bottom lines run perpendicular to each other, thus forming a crossbar array structure as shown in FIG. 7.

Figure 6:
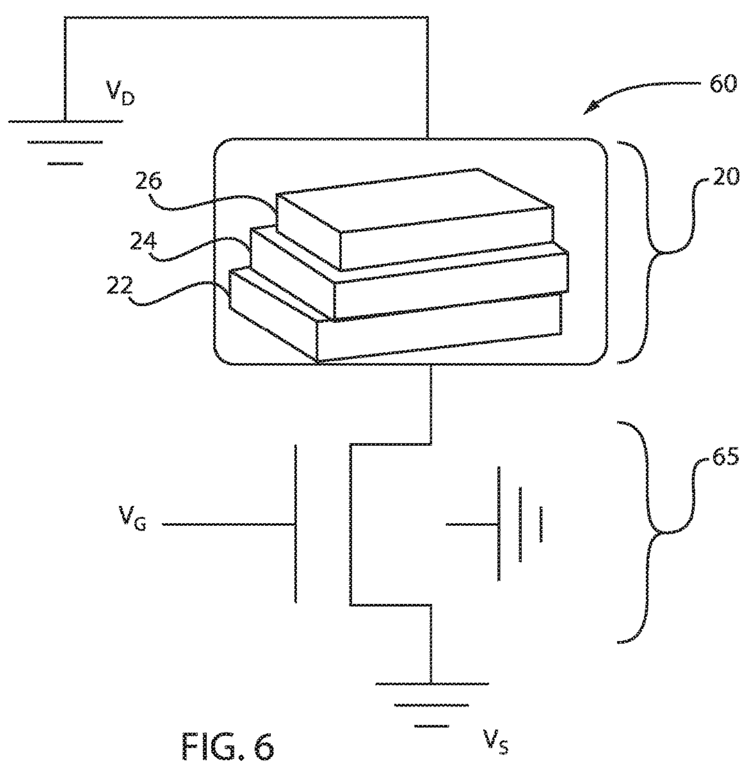
FIG. 6 is a basic cell structure for a one transistor-one resistor (1T1R) RRAM, in accordance with an embodiment of the present invention.

FIG. 6 is a basic cell structure for a 1T1R-RRAM, in accordance with an embodiment of the present invention.

In various example embodiments, the cell structure 60 includes the resistive switching memory element 20 and a transistor 65. The resistive switching memory element 20 can include an insulating layer 24 sandwiched between a first metal layer 22 and a second metal layer 26. The transistor 65 includes a source, drain, and gate. In one example, the resistive switching memory element 20 is placed between the drain and gate.

Figure 7:
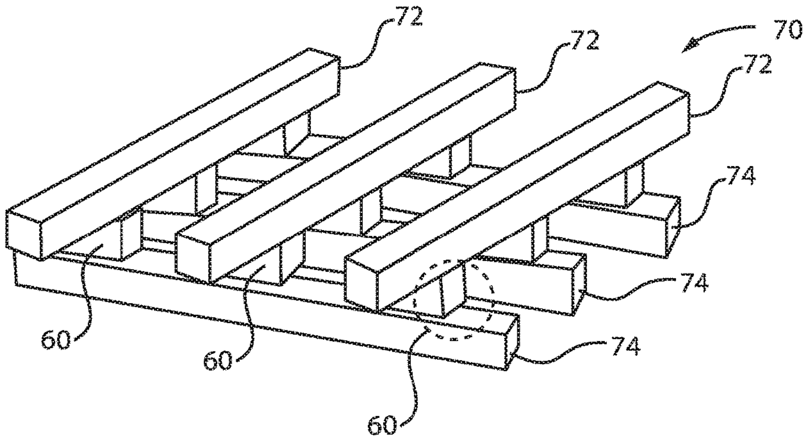
FIG. 7 is an exemplary 3D RRAM crossbar array incorporating the RRAM devices of FIGS. 4 and 5, in accordance with an embodiment of the present invention.

FIG. 7 is an exemplary 3D RRAM crossbar array 70 incorporating the RRAM devices of FIGS. 4 and 5, in accordance with an embodiment of the present invention.

In various example embodiments, the semiconductor structure 60 represents a memory cell incorporated between a plurality of bit lines 72 and a plurality of word lines 74. Thus, the array 70 is obtained by perpendicular conductive wordlines (rows) 74 and bitlines (columns) 72, where a cell structure 60 with resistive memory element exists at the intersection between each row and column. The cell structure 60 with resistive memory element can be accessed for read and write by biasing the corresponding wordline 74 and bitline 72.

Figure 8:
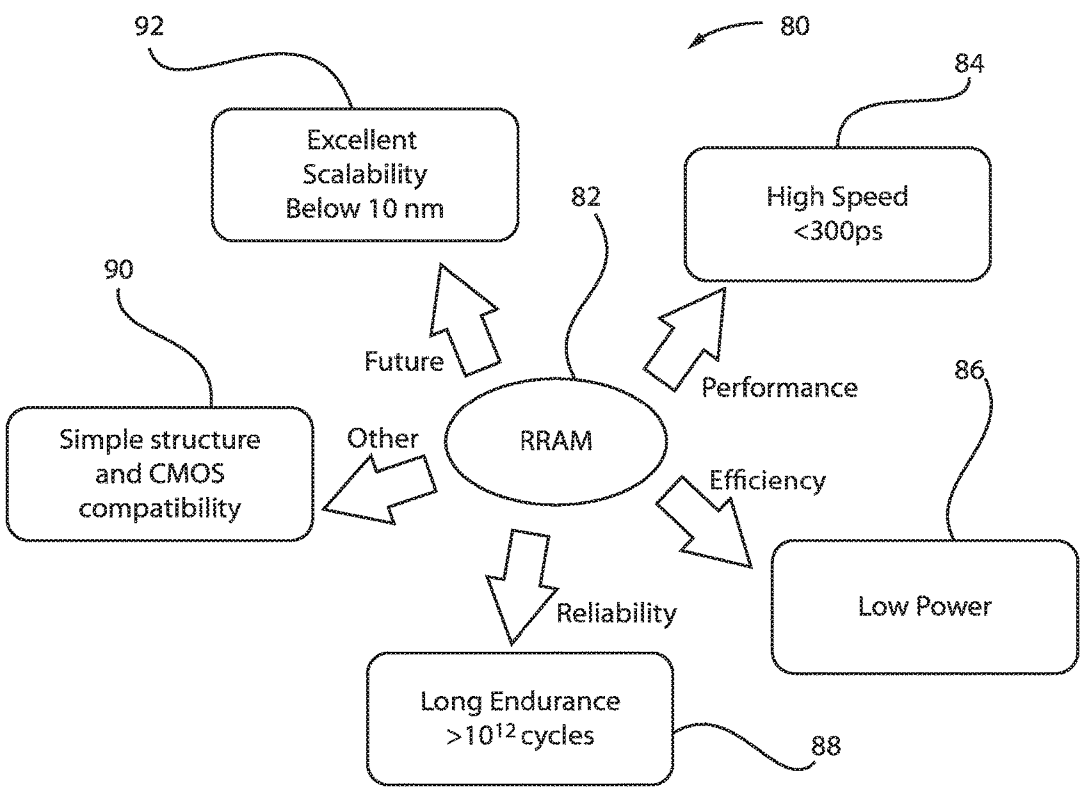
FIG. 8 is an exemplary diagram illustrating prospects the of the RRAM device of FIGS. 4 and 5, in accordance with an embodiment of the present invention.

FIG. 8 is an exemplary diagram 80 illustrating the prospects of the RRAM devices of FIGS. 4 and 5, in accordance with an embodiment of the present invention.

In various example embodiments, the RRAM-based device 82 provides for high speed processing 84, low power consumption 86, long endurance 88, simple structure and CMOS compatibility 90, and scalability 92. These factors help RRAM-based devices 82 achieve better performance, higher efficiency, and more reliability. Such RRAM based device is described with reference to FIGS. 1-6.

In summary, resistive random access memory (RRAM) is considered a promising technology for electronic synapse devices or memristor devices for neuromorphic computing, as well as high-density and high-speed non-volatile memory applications. In neuromorphic computing applications, a resistive memory device can be used as a connection (synapse) between a pre-neuron and a post-neuron, representing connection weight in the form of device resistance. Multiple pre-neurons and post-neurons can be connected through a crossbar or crosspoint array of RRAMs, which naturally expresses a fully-connected neural network.

In order to construct a large scale crossbar array, each cross point needs to have a high resistance (or low leakage current). Otherwise, voltage drop across the metal lines becomes an issue. RRAM devices usually have low switching resistance (~kOhm) due to a filamentary nature. This demands line resistance reduction beyond the conventional back end of line (BEOL) to enable large crossbar array structures. The exemplary embodiments of the present invention alleviate this issue by lodging or wedging an RRAM stack between Cu regions and a wraparound top electrode metal line.

Moreover, emerging memories can be fabricated in the BEOL at relatively low temperatures, which allows for easy integration with CMOS devices and stacking in 3D. For all these reasons, resistive memories are promising not only for nonvolatile memories, but also for computing memories, thus allowing for fast data access and for computing architectures blurring a distinction between memory and computing circuits, such as nonvolatile memristive logic computation or neuromorphic networks.

Among the emerging memory technologies, RRAM is one of the most promising devices given its good cycling endurance, high speed, ease of fabrication and good scaling behavior. One of the most significant strengths of RRAM against phase change memory (PCM) and spin-transfer torque memories (STTRAM) is its simple structure, including only an insulating layer inserted between two or more metallic layers. Also, current consumption in RRAM is low because of filamentary conduction, whereas a programming current in PCM and STTRAM is proportional to a device area.

Given this strong potential, large scale RRAM devices are presented herein using a crossbar architecture. RRAM has also been demonstrated with a relatively small scale, aimed at embedded memory applications in the automotive industry, smart cards, and smart sensors for Internet of Things (IoT) markets. Embedded RRAM provides advantages over flash memory, such as lower energy consumption and higher speed. On the other hand, crossbar RRAM offers a higher density compared to DRAM and a higher speed compared to flash memory, in addition to nonvolatile behavior and 3D integration. These are ideal properties for storage class memory (SCM) applications, filling a gap between DRAM (high performance, low density) and flash memory (high density, slow operation). The exemplary embodiments of the present invention achieve such results by lodging or wedging or embedding a RRAM stack between Cu regions and a wraparound top electrode metal line for increasing metal line volume to efficiently reduce resistance and to provide for a better contact between the top metal line and the RRAM.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a wraparound top electrode line for a crossbar array resistive switching device (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, the method comprising:

depositing an insulating layer in direct contact with a semiconductor substrate;

etching the insulating layer to form a plurality of trenches for receiving a first conducting material;

forming a resistive switching memory element over at least one trench of the plurality of trenches, where a conducting cap is formed in direct contact with a top surface of the resistive switching memory element;

depositing a dielectric cap over the trenches;

etching portions of the insulating layer to expose a section of the dielectric cap formed over the resistive switching memory element;

etching the exposed section of the dielectric cap to expose the conducting cap of the resistive switching memory element; and forming a barrier layer in direct contact with the exposed section of the conducting cap.

2. The method of claim 1, wherein the dielectric cap extends over and contacts each of the plurality of trenches.

3. The method of claim 1, wherein the first conducting material is copper (Cu).

4. The method of claim 1, wherein the resistive switching memory element is a resistive random access memory (RRAM) device.

5. The method of claim 1, wherein the resistive switching memory element is a conductive bridging random access memory (CBRAM) device.

6. The method of claim 1, wherein the resistive switching memory element is covered by a spacer.

7. The method of claim 6, wherein the spacer is a silicon nitride (SiN) spacer.

8. The method of claim 1, further comprising depositing a second conducting material within the barrier layer.

9. The method of claim 8, wherein the second conducting material is Cu.

10. The method of claim 1, wherein the barrier layer includes at least of one tantalum nitride (TaN), titanium nitride (TiN), cobalt nitride (CoN), and ruthenium (RuN).

11. The method of claim 1, wherein the conducting cap is wrapped around with the barrier layer.

12. A method for forming a semiconductor device, the method comprising:

forming a plurality of copper (Cu) contacts within an insulating layer;

forming a resistive random access memory (RRAM) device over one Cu line of the plurality of Cu lines;

forming a conducting cap in direct contact with a top surface of the RRAM device;

forming a dielectric cap that extends over and directly contacts each of the plurality of Cu lines;

selectively etching to expose the conducting cap of the RRAM device; and forming a barrier layer in direct contact with the exposed conducting cap such that the conducting cap wraps around with the barrier layer.

13. The method of claim 12, wherein the RRAM device is covered by a silicon nitride (SiN) spacer.

14. The method of claim 12, wherein the barrier layer includes at least of one tantalum nitride (TaN), titanium nitride (TiN), cobalt nitride (CoN), and ruthenium (RuN).

15. A semiconductor structure incorporated within a crossbar array, the structure comprising:

a plurality of trenches formed within an insulating layer for receiving a first conducting material;

a resistive switching memory element formed over at least one trench of the plurality of trenches, where a conducting cap is formed in direct contact with a top surface of the resistive switching memory element;

a dielectric cap deposited over the trenches; and a barrier layer formed in direct contact with an exposed section of the conducting cap such that the conducting cap wraps around with the barrier layer.

16. The structure of claim 15, wherein the dielectric cap extends over and contacts each of the plurality of trenches.

17. The structure of claim 15, wherein the first conducting material is copper (Cu).

18. The structure of claim 15, wherein a second conducting material is deposited over the barrier layer.

19. The structure of claim 18, wherein the second conducting material is Cu.

20. The structure of claim 15, wherein the barrier layer includes at least of one tantalum nitride (TaN), titanium nitride (TiN), cobalt nitride (CoN), and ruthenium (RuN).

* * * * *